(12) United States Patent
Tsai et al.

(10) Patent No.: US 11,264,963 B1
(45) Date of Patent: Mar. 1, 2022

(54) INPUT BUFFER CIRCUIT

(71) Applicant: ELITE SEMICONDUCTOR MICROELECTRONICS TECHNOLOGY INC., Hsinchu (TW)

(72) Inventors: Cheng-Hung Tsai, Hsinchu (TW); Chien-Yi Chang, Hsinchu (TW)

(73) Assignee: ELITE SEMICONDUCTOR MICROELECTRONICS TECHNOLOGY INC., Hsinchu (TW)

(*) Notice: Subject to any disclaimer, the term of this patent is extended or adjusted under 35 U.S.C. 154(b) by 0 days.

(21) Appl. No.: 16/993,292

(22) Filed: Aug. 14, 2020

(51) Int. Cl.
*H03F 3/45* (2006.01)

(52) U.S. Cl.
CPC ... *H03F 3/45475* (2013.01); *H03F 2200/129* (2013.01); *H03F 2200/267* (2013.01); *H03F 2203/45512* (2013.01); *H03F 2203/45544* (2013.01)

(58) Field of Classification Search
CPC ........................................................ H03F 3/45
USPC ................................................... 330/252, 69
See application file for complete search history.

(56) References Cited

U.S. PATENT DOCUMENTS

| | | | |
|---|---|---|---|
| 7,683,691 B2 | 3/2010 | Kumata | |
| 8,134,401 B2* | 3/2012 | Hunter | H03K 5/24 327/337 |
| 8,693,557 B1 | 4/2014 | Zhang et al. | |
| 2003/0058044 A1* | 3/2003 | Candy | H03F 1/083 330/109 |

\* cited by examiner

*Primary Examiner* — Henry Choe

(57) ABSTRACT

An input buffer circuit includes an input differential amplifier unit, a differential amplifier stage, and a buffer. The input differential amplifier unit has input terminals and at least one output terminal, wherein at least two of the input terminals of the input differential amplifier unit are configured to be capacitively coupled respectively so as to provide at least one pair of signal paths for a first input signal and a second input signal of a differential input signal. The differential amplifier stage, coupled to the input differential amplifier unit, has first and second differential input terminals, and a corresponding output terminal, wherein the first and second differential input terminals are capable of being coupled to the first input signal and the second input signal respectively. The buffer, coupled to the output terminal of the differential amplifier stage, is used for outputting an output single-ended signal.

14 Claims, 5 Drawing Sheets

INPUT BUFFER CIRCUIT

BACKGROUND OF THE INVENTION

1. Field of the Invention

The present disclosure relates to an input buffer circuit, and in particular to an input buffer circuit capable of enhancing reliability by providing protection against accidental shorting or connection of one of either a first or a second clock signal of a differential clock input signal to a power source or ground.

2. Description of the Related Art

For receiving one or more input signals from a first circuit, an input buffer is employed in a second circuit to prevent the second circuit from unacceptably loading the first circuit and interfering with the first circuit's desired operation. Among the input signals, a clock signal is usually transmitted for signal synchronization between two different circuits. In higher data rate applications, for example, memory devices, such as double-data-rate (DDR) series memory devices, a differential clock signal which is a pair of first and second clock signals is typically transmitted, instead of transmission of a single-ended clock signal, because of many benefits of using differential signaling, such as common-mode noise rejection.

Accordingly, an input buffer for receiving a differential clock signal usually utilizes a subtractor, for example, realized by using a differential amplifier, for receiving the differential clock signal so as to obtain a single clock signal for use in the second circuit by way of conceptual subtraction of the first and second clock signals of the differential clock signal, thereby reducing electronic crosstalk and electromagnetic interference imposed on the differential clock signals during transmission.

Based on this approach, a clock receiver can be implemented to include a capacitive coupling circuit for filtering out direct-current voltages from a differential clock signal, such as in U.S. Pat. No. 8,693,557, entitled "AC coupled clock receiver with common-mode noise rejection." In this way, the capacitive coupling circuit can also reject common-mode noise in the differential clock signal.

However, if a power source or ground is accidentally connected or shorted to one of either the first or second clock signal received by a differential amplifier of the above examples or one of input terminals of the differential amplifier, the differential amplifier may output a waveform with distortion and inconsistent with the differential clock signal, thereby causing data error in the subsequent processing in the second circuit.

BRIEF SUMMARY OF THE INVENTION

An objective of the present disclosure is to provide an input buffer circuit capable of having additional signal paths for first and second input signals of a differential input signal so as to facilitate protection against accidental shorting of an input terminal of the input buffer circuit to a voltage or ground.

To achieve the above objective, the present disclosure provides embodiments of an input buffer circuit. The input buffer circuit comprises an input differential amplifier unit, a differential amplifier stage, and a buffer. The input differential amplifier unit has a plurality of input terminals and at least one output terminal, wherein at least two of the input terminals of the input differential amplifier unit are configured to be capacitively coupled respectively so as to provide at least one pair of signal paths for a first input signal and a second input signal of a differential input signal. The differential amplifier stage, coupled to the input differential amplifier unit, has a first differential input terminal, a second differential input terminal, and a corresponding output terminal, wherein the first differential input terminal and the second differential input terminal are capable of being coupled to the first input signal and the second input signal respectively. The buffer, coupled to the output terminal of the differential amplifier stage, is used for outputting an output single-ended signal.

In an embodiment, the input differential amplifier unit includes a first amplifier stage. The first amplifier stage includes a first differential amplifier having a first input terminal, a second input terminal, and a first output terminal as the output terminal of the input differential amplifier unit, wherein the first input terminal and the second input terminal are configured to be capacitively coupled to the first input signal and the second input signal respectively so as to provide a pair of signal paths for the first input signal and the second input signal, and the first output terminal is coupled to the corresponding output terminal of the differential amplifier stage; and wherein the first and second input terminals are the two input terminals of the input differential amplifier unit, and the first output terminal is the output terminal of the input differential amplifier unit.

In an embodiment, the first amplifier stage further includes a capacitive coupling circuit, wherein the first input terminal and the second input terminal are capable of receiving the first input signal and the second input signal respectively through the capacitive coupling circuit.

In an embodiment, the capacitive coupling circuit includes a first capacitor coupled to the first input terminal and a second capacitor coupled to the second input terminal.

In an embodiment, the input differential amplifier unit includes a first amplifier stage, a second amplifier stage, a third amplifier stage, and a fourth amplifier stage. The first amplifier stage includes a first differential amplifier having a first input terminal, a second input terminal, and a first output terminal, wherein the first input terminal and the second input terminal are capable of receiving the first input signal and the second input signal respectively. The second amplifier stage includes a second differential amplifier having a third input terminal, a fourth input terminal, and a second output terminal, wherein the third input terminal and the fourth input terminal are configured to be capacitively coupled to the first input signal and the second input signal respectively so as to provide a first pair of signal paths for the first input signal and the second input signal. The third amplifier stage includes a third differential amplifier having a fifth input terminal, a sixth input terminal, and a third output terminal, wherein the fifth input terminal and the sixth input terminal are capable of receiving the second input signal and the first input signal respectively. The fourth amplifier stage includes a fourth differential amplifier having a seventh input terminal, an eighth input terminal, and a fourth output terminal, wherein the seventh input terminal and the eighth input terminal are configured to be capacitively coupled to the second input signal and the first input signal respectively so as to provide a second pair of signal paths for the first input signal and the second input signal. The first and second output terminals are coupled to the first differential input terminal and the third and fourth output terminals are coupled to the second differential input terminal. The input terminals of the input differential amplifier unit include the first to eighth input terminals, and the input differential amplifier unit has output terminals including the first to fourth output terminals.

In an embodiment, the input differential amplifier unit further includes a first capacitive coupling circuit and a second capacitive coupling circuit. The third input terminal and the fourth input terminal are capable of receiving the first input signal and the second input signal respectively through the first capacitive coupling circuit. The seventh input terminal and the eighth input terminal are capable of receiving the second input signal and the first input signal respectively through the second capacitive coupling circuit.

In an embodiment, the first capacitive coupling circuit includes a first capacitor coupled to the third input terminal and a second capacitor coupled to the fourth input terminal.

In an embodiment, the second capacitive coupling circuit includes a third capacitor coupled to the seventh input terminal and a fourth capacitor coupled to the eighth input terminal.

In an embodiment, the input differential amplifier unit includes a first amplifier stage and a second amplifier stage. The first amplifier stage includes a first differential amplifier having a first input terminal, a second input terminal, and a first output terminal, wherein the first input terminal and the second input terminal are capable of receiving the first input signal and the second input signal respectively; the first input terminal is configured to be capacitively coupled to the first output terminal and the first output terminal is coupled to the first differential input terminal so as to provide a first signal path for the first input signal. The second amplifier stage includes a second differential amplifier having a third input terminal, a fourth input terminal, and a second output terminal, wherein the third input terminal and the fourth input terminal are capable of receiving the first input signal and the second input signal respectively; the fourth input terminal is configured to be capacitively coupled to the second output terminal and the second output terminal is coupled to the second differential input terminal so as to provide a second signal path for the second input signal. The input terminals of the input differential amplifier unit include the first to fourth input terminals, and the input differential amplifier unit has a plurality of output terminals including the first and second output terminals.

In an embodiment, the input differential amplifier unit includes a first capacitive coupling circuit, coupled between the first input terminal and the first output terminal; and a second capacitive coupling circuit, coupled between the fourth input terminal and the second output terminal.

In an embodiment, the first capacitive coupling circuit includes a first capacitor coupled between the first input terminal and the first output terminal.

In an embodiment, the second capacitive coupling circuit includes a second capacitor coupled between the fourth input terminal and the second output terminal.

In some embodiments, the buffer includes at least one inverter.

In an embodiment, the differential input signal is a differential clock signal.

DETAILED DESCRIPTION OF THE INVENTION

To facilitate understanding of the object, characteristics and effects of this present disclosure, embodiments together with the attached drawings for the detailed description of the present disclosure are provided.

Embodiments of an input buffer circuit will be provided, which are capable of having additional signal paths for first and second input signals of a differential input signal. As will be illustrated below, the input buffer circuit with the additional signal paths can facilitate protection against accidental shorting of an input terminal of the input buffer circuit to a voltage or ground, thus increasing reliability of a device (e.g., a data receiver, a network device, a computing device, a memory device, etc) that utilizes the input buffer circuit.

Figure 1:
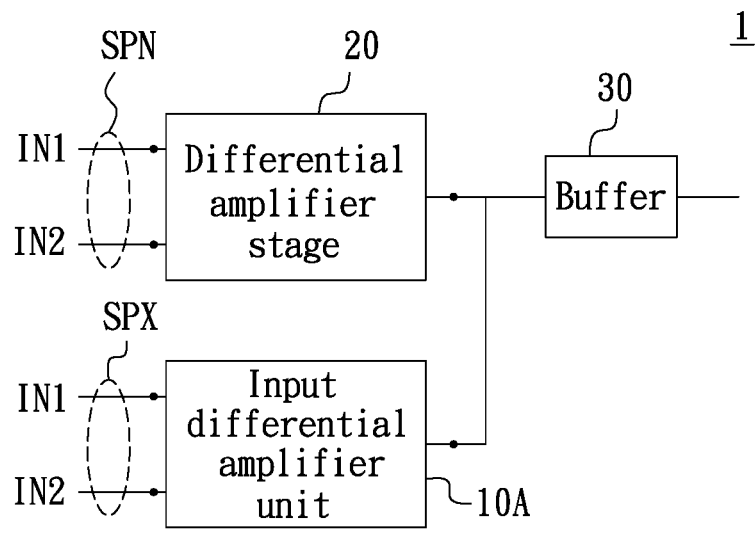
FIG. 1 is a block diagram illustrating an input buffer circuit in accordance with an embodiment of the present disclosure.
Figure 2:
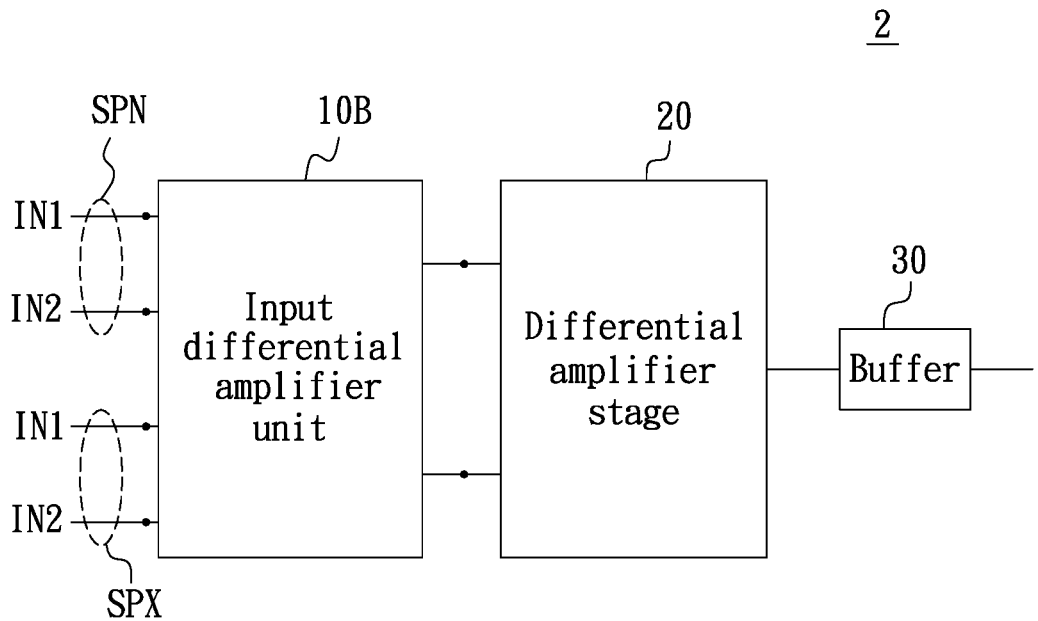
FIG. 2 is a block diagram illustrating an input buffer circuit in accordance with another embodiment of the present disclosure.

Referring to FIG. 1 or 2, an input buffer circuit in accordance with various embodiments of the present disclosure is illustrated in a block diagram. As shown in FIG. 1 or 2, an input buffer circuit 1 (or 2) includes an input differential amplifier unit 10A (or 10B), a differential amplifier stage 20, and a buffer 30.

The input differential amplifier unit (e.g., 10A or 10B) has a plurality of input terminals and at least one output terminal, wherein at least two of the input terminals of the input differential amplifier unit (e.g., 10A or 10B) are configured to be capacitively coupled respectively so as to provide at least one pair of signal paths, indicated by SPX, for a first input signal IN1 and a second input signal IN2 of a differential input signal.

The differential amplifier stage 20, coupled to the input differential amplifier unit (e.g., 10A or 10B), has a first differential input terminal, a second differential input terminal, and a corresponding output terminal. The first differential input terminal and the second differential input terminal are capable of being coupled to the first input signal IN1 and the second input signal IN2 respectively so as to provide another pair of signal paths, indicated by SPN, for the first input signal IN1 and the second input signal IN2, as illustrated in FIG. 1.

The buffer 30, coupled to the output terminal of the differential amplifier stage 20, is used for outputting an output single-ended signal.

As shown in FIGS. 1 and 2, the differential amplifier stage 20 can be coupled to the input differential amplifier unit (e.g., 10A or 10B) in different manners.

In the embodiment shown in FIG. 1, the output terminal of the differential amplifier stage 20 can be coupled (e.g., electrically connected) to that of the input differential amplifier unit 10A in a parallel manner.

In the embodiment shown in FIG. 2, the differential amplifier stage 20 can be coupled (e.g., electrically connected) to the input differential amplifier unit 10B in a cascaded manner. For example, the input differential amplifier unit 10B, as compared to the input differential amplifier unit 10A of FIG. 1, further has two input terminals capable of being coupled to the first input signal IN1 and the second input signal IN2 respectively so as to provide another pair of signal paths, indicated by SPN, for the first input signal IN1 and the second input signal IN2. In this way, the input differential amplifier unit 10B has two output terminals which can be coupled (e.g., electrically connected) to the first and second differential input terminals of the differential amplifier stage 20, respectively.

As illustrated in the embodiments, the input buffer circuit (e.g., 1 or 2) includes the input differential amplifier unit (e.g., 10A or 10B) and a differential amplifier stage 20 so as to include at least two amplifier stages capable of providing at least one pair of signal paths (e.g., SPN) for the differential input signal and at least one pair of capacitively coupled signal paths (e.g., SPX) for the differential input signal. Such a circuit configuration of the input buffer circuit can facilitate protection against accidental shorting of an input terminal of the input buffer circuit to a voltage or ground, as will be exemplified below.

Figure 3:
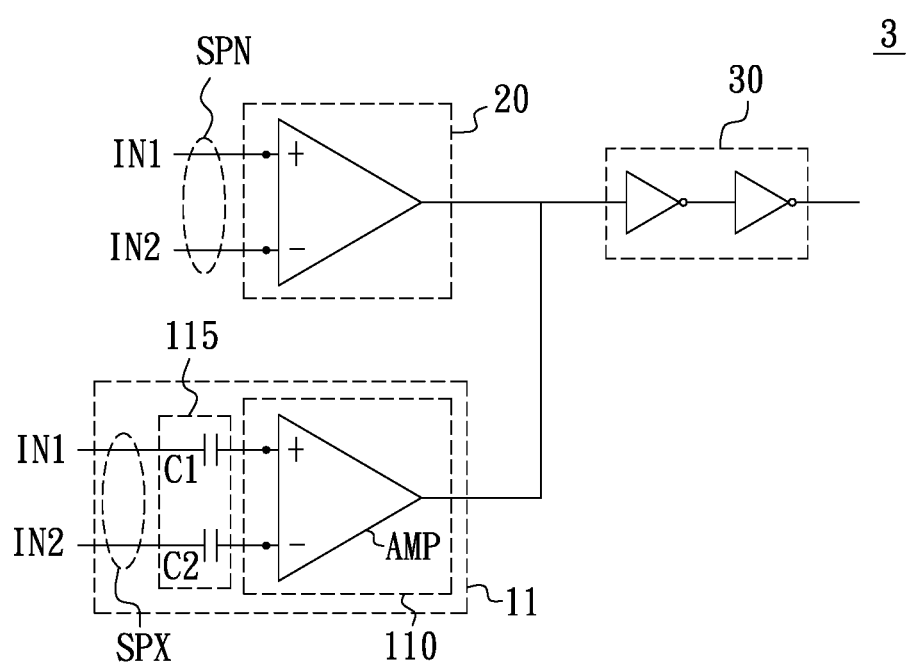
FIG. 3 is a block diagram illustrating an embodiment of an input buffer circuit based on FIG. 1.

FIG. 3 illustrates an embodiment of an input buffer circuit based on FIG. 1 in block diagram form. As shown in FIG. 3, an input buffer circuit 3 includes an input differential amplifier unit 11, a differential amplifier stage 20, and a buffer 30. In FIG. 3, the differential amplifier stage 20 is coupled (e.g., electrically connected) to the input differential amplifier unit 11 in a parallel manner.

The input differential amplifier unit 11 has two input terminals and an output terminal, wherein the two input terminals of the input differential amplifier unit 11 are capacitively coupled respectively so as to provide at least one pair of signal paths for a first input signal IN1 and a second input signal IN2 of a differential input signal. The differential amplifier stage 20, coupled to the input differential amplifier unit 11, has a first differential input terminal, a second differential input terminal, and a corresponding output terminal, wherein the first differential input terminal and the second differential input terminal are capable of being coupled to the first input signal IN1 and the second input signal IN2 respectively. The buffer 30, coupled to the output terminal of the differential amplifier stage 20, is used for outputting an output single-ended signal.

As shown in FIG. 3, the input differential amplifier unit 11 includes an amplifier stage 110. The first amplifier stage 110 includes a first differential amplifier AMP having a first input terminal, a second input terminal, and a first output terminal as the output terminal of the input differential amplifier unit 11, wherein the first input terminal and the second input terminal are configured to be capacitively coupled to the first input signal IN1 and the second input signal IN2 respectively so as to provide a pair of signal paths for the first input signal IN1 and the second input signal IN2, and the first output terminal is coupled to the corresponding output terminal of the differential amplifier stage 20; and wherein the first and second input terminals are the two input terminals of the input differential amplifier unit 11, and the first output terminal is the output terminal of the input differential amplifier unit 11.

In an embodiment, the first amplifier stage 110 further includes a capacitive coupling circuit 115, wherein the first input terminal and the second input terminal are capable of receiving the first input signal IN1 and the second input signal IN2 respectively through the capacitive coupling circuit 115.

In an embodiment, the capacitive coupling circuit 115 includes a first capacitor C1 coupled to the first input terminal and a second capacitor C2 coupled to the second input terminal.

In an embodiment, the buffer 30 may include at least one inverter as an inverting buffer. In another embodiment, the buffer may include a plurality of inverters (e.g., two inverters) connected as a buffer gate, as shown in FIG. 3.

As shown in FIG. 3, the input buffer circuit 3 includes the input differential amplifier unit 11 and the differential amplifier stage 20 so as to include at least two amplifier stages capable of providing at least one pair of signal paths (e.g., SPN) for the differential input signal and at least one pair of capacitively coupled signal paths (e.g., SPX) for the differential input signal.

In a practical application of the input buffer circuit 3, the two input terminals of the input differential amplifier unit 11 provide a pair of signal paths SPN for receiving the differential input signal (e.g., IN1 and IN2), and the first differential input terminal and the second differential input terminal of the differential amplifier stage 20 provide a pair of capacitively coupled signal paths SPX for receiving the differential input signal (e.g., IN1 and IN2). In a normal situation, there is no undesirable connection of the above four input terminals to a voltage (e.g., a voltage source) or ground. In this normal situation, the differential amplifier stage 20, which provides the pair of signal paths SPN, can dominate the operation of the input buffer circuit 3 so that the buffer 30 can output the output single-ended signal which is based on the differential input signal.

In an accidental situation that when one of the two input terminals of the input differential amplifier unit 11 is accidentally connected to a voltage (e.g., a voltage source) or ground, since the differential amplifier stage 20, which provides the pair of signal paths SPN, can dominate the operation of the input buffer circuit 3 so that the buffer 30 can still output the output single-ended signal as in the normal operation.

In another accidental situation that when one of the first and second differential input terminals of the differential amplifier stage 20 is accidentally connected to a voltage (e.g., a voltage source) or ground, the input differential amplifier unit 11, which provides the pair of signal paths SPX, can dominate the operation of the input buffer circuit 3 so that the buffer 30 can still output the output single-ended signal normally. For example, when the differential input signal is a differential clock signal, the input buffer circuit 3 can output the output single-ended signal having a duty cycle corresponding to that of the differential clock signal.

As compared to the conventional input buffer circuit having only one amplifier stage (or only one pair of signal paths) for the differential input signal, the input buffer circuit 3 is more reliable because of having two pairs of signal paths for the differential input signal, thereby further reducing the risks of accidental connection of the input terminal to a voltage or ground.

Thus, the circuit configuration of the input buffer circuit 3 can facilitate protection against accidental shorting of an input terminal of the input buffer circuit to a voltage or ground, enhancing the reliability of a device that employs the input buffer circuit 3.

Figure 4:
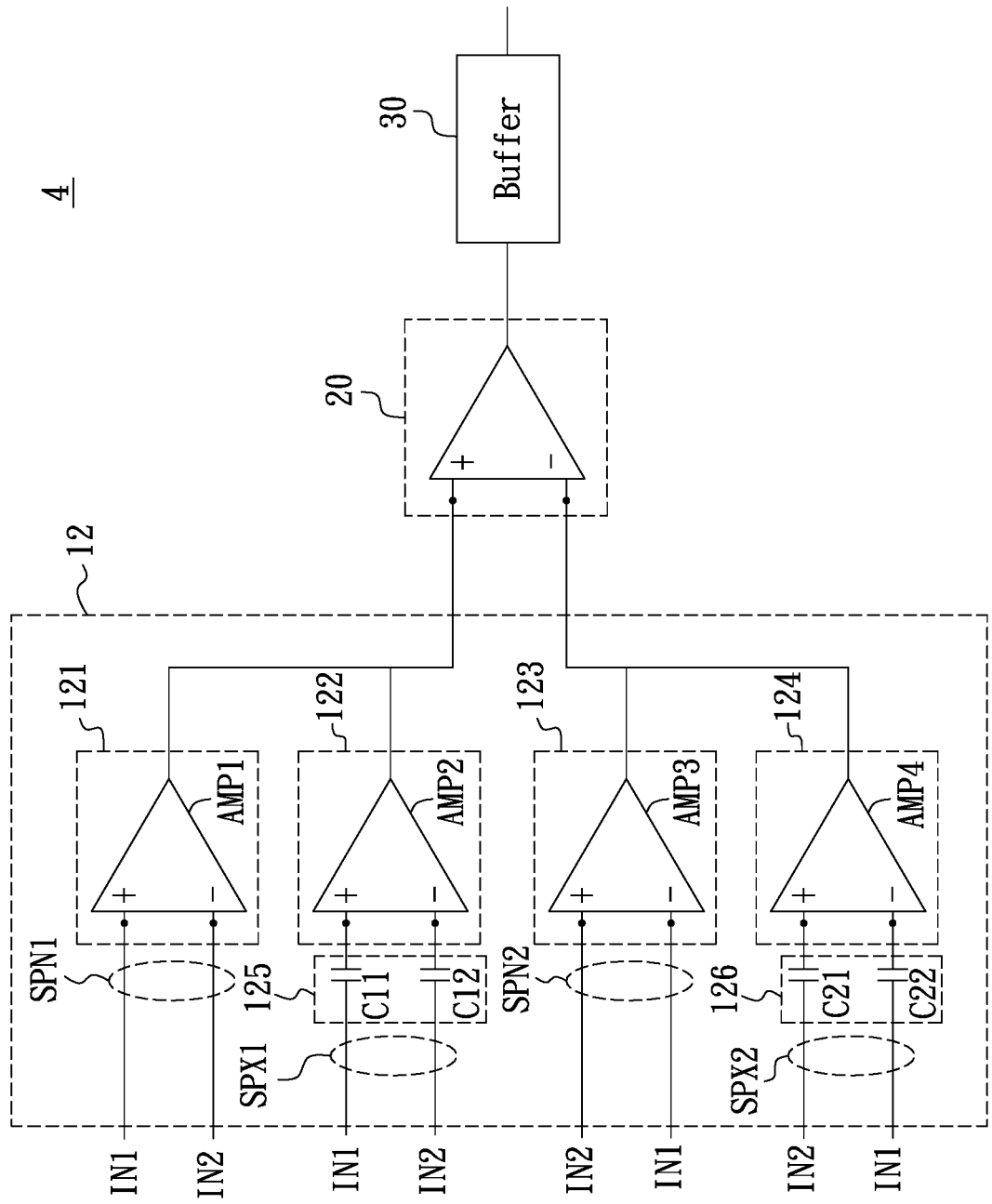
FIG. 4 is a block diagram illustrating an embodiment of an input buffer circuit based on FIG. 2.

FIG. 4 is a block diagram illustrating an embodiment of an input buffer circuit based on FIG. 2. As shown in FIG. 4, an input buffer circuit 4 includes an input differential amplifier unit 12, a differential amplifier stage 20, and a buffer 30.

In FIG. 4, the differential amplifier stage 20 is coupled (e.g., electrically connected) to the input differential amplifier unit 12 in a cascaded manner.

In an embodiment, the input differential amplifier unit 12 includes a first amplifier stage 121, a second amplifier stage 122, a third amplifier stage 123, and a fourth amplifier stage 124. The first amplifier stage 121 includes a first differential amplifier AMP1 having a first input terminal (e.g., a non-inverting terminal), a second input terminal (e.g., an inverting terminal), and a first output terminal, wherein the first input terminal and the second input terminal are capable of receiving the first input signal IN1 and the second input signal IN2 respectively. The second amplifier stage 122 includes a second differential amplifier AMP2 having a third input terminal (e.g., a non-inverting terminal), a fourth input terminal (e.g., an inverting terminal), and a second output terminal, wherein the third input terminal and the fourth input terminal are configured to be capacitively coupled to the first input signal IN1 and the second input signal IN2 respectively so as to provide a first pair of signal paths (e.g., indicated by SPX1) for the first input signal IN1 and the second input signal IN2. The third amplifier stage 123 includes a third differential amplifier AMP3 having a fifth input terminal (e.g., a non-inverting terminal), a sixth input terminal (e.g., an inverting terminal), and a third output terminal, wherein the fifth input terminal and the sixth input terminal are capable of receiving the second input signal IN2 and the first input signal IN1 respectively. The fourth amplifier stage 124 includes a fourth differential amplifier AMP4 having a seventh input terminal (e.g., a non-inverting terminal), an eighth input terminal (e.g., an inverting terminal), and a fourth output terminal, wherein the seventh input terminal and the eighth input terminal are configured to be capacitively coupled to the second input signal IN2 and the first input signal IN1 respectively so as to provide a second pair of signal paths (e.g., indicated by SPX2) for the first input signal IN1 and the second input signal IN2. The first and second output terminals are coupled to the first differential input terminal and the third and fourth output terminals are coupled to the second differential input terminal. The input terminals of the input differential amplifier unit 12 include the first to eighth input terminals, and the input differential amplifier unit 12 has output terminals including the first to fourth output terminals.

In an embodiment, the input differential amplifier unit 12 further includes a first capacitive coupling circuit 125 and a second capacitive coupling circuit 126. The third input terminal and the fourth input terminal are capable of receiving the first input signal IN1 and the second input signal IN2 respectively through the first capacitive coupling circuit 125. The seventh input terminal and the eighth input terminal are capable of receiving the second input signal IN2 and the first input signal IN1 respectively through the second capacitive coupling circuit 126.

In an embodiment, the first capacitive coupling circuit 125 includes a first capacitor C11 coupled to the third input terminal and a second capacitor C12 coupled to the fourth input terminal.

In an embodiment, the second capacitive coupling circuit 126 includes a third capacitor C21 coupled to the seventh input terminal and a fourth capacitor C22 coupled to the eighth input terminal.

As shown in FIG. 4, the input buffer circuit 4 includes the input differential amplifier unit 12 and the differential amplifier stage 20 so as to provide four pairs of different signal paths (e.g., SPN1, SPN2, SPX1, SPX2) for the differential input signal.

In a practical application of the input buffer circuit 4, the first and second input terminals, fifth and sixth input terminal of the input differential amplifier unit 12 provide two pairs of signal paths (e.g., SPN1, SPN2) for receiving the differential input signal while the third and fourth input terminals, seventh and eighth input terminals of the input differential amplifier unit 12 provide two pairs of capacitively coupled signals paths (e.g., SPX1, SPX2) for the differential input signal, wherein there is no undesirable connection of the above input terminals to a voltage (e.g., a voltage source) or ground. In a normal situation, the first and third differential amplifiers AMP1 and AMP3, which provide the two pairs of signal paths SPN1 and SPN2, can dominate the operation of the input buffer circuit 4 so that the buffer 30 can output the output single-ended signal which is based on the differential input signal.

In an accidental situation that when one terminal of the two pairs of input terminals of the input differential amplifier unit 12 for providing the two pairs of capacitively coupled signal paths SPX1 and SPX2 is accidentally connected to a voltage (e.g., a voltage source) or ground, since the first and third differential amplifiers AMP1 and AMP3, which provide the two pairs of signal paths SPN1 and SPN2, can dominate the operation of the input buffer circuit 4 so that the buffer 30 can still output the output single-ended signal as in the normal operation.

In another accidental situation that when one terminal of the two pairs of input terminals of the input differential amplifier unit 12 for providing the two pairs of signal paths SPN1 and SPN2 is accidentally connected to a voltage (e.g., a voltage source) or ground, the second and fourth differential amplifiers AMP2 and AMP4, which provide the two pairs of capacitively coupled signal paths SPX1 and SPX2, can dominate the operation of the input buffer circuit 4 so that the buffer 30 can still output the output single-ended signal normally. For example, when the differential input signal is a differential clock signal, the input buffer circuit 4 can output the output single-ended signal having a duty cycle corresponding to that of the differential clock signal.

As compared to the input buffer circuit 3, the input buffer circuit 4 is more reliable because of having four pairs of signal paths for the differential input signal, thereby further reducing the risks of accidental connection of the input terminal to a voltage or ground.

Thus, the circuit configuration of the input buffer circuit 4 can facilitate protection against accidental shorting of an input terminal of the input buffer circuit to a voltage or ground, enhancing the reliability of a device that employs the input buffer circuit 4.

Figure 5:
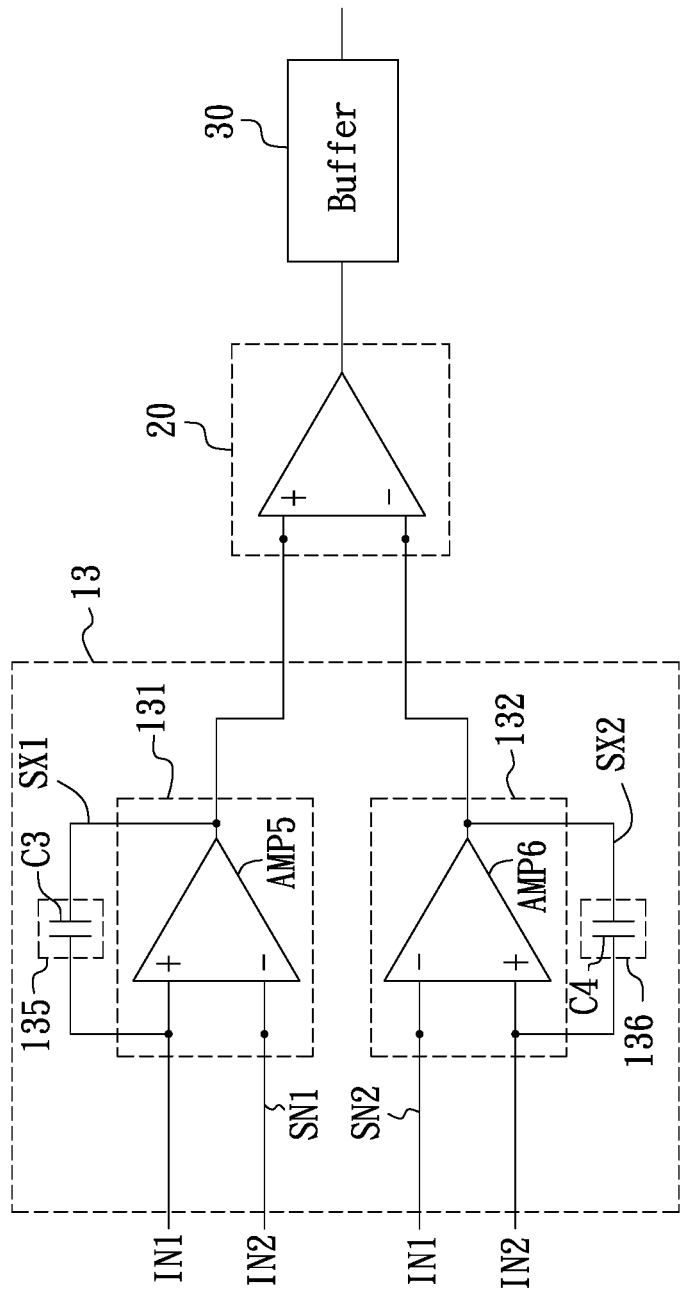
FIG. 5 is a block diagram illustrating another embodiment of an input buffer circuit based on FIG. 2.

FIG. 5 is a block diagram illustrating another embodiment of an input buffer circuit based on FIG. 2. As shown in FIG. 5, an input buffer circuit 5 includes an input differential amplifier unit 13, a differential amplifier stage 20, and a buffer 30. In FIG. 5, the differential amplifier stage 20 is coupled (e.g., electrically connected) to the input differential amplifier unit 13 in a cascaded manner.

In an embodiment, the input differential amplifier unit 13 includes a first amplifier stage 131 and a second amplifier stage 132. The first amplifier stage 131 includes a first differential amplifier AMP5 having a first input terminal (e.g., a non-inverting terminal), a second input terminal (e.g., an inverting terminal), and a first output terminal, wherein the first input terminal and the second input terminal are capable of receiving the first input signal IN1 and the second input signal IN2 respectively. The first input terminal is configured to be capacitively coupled to the first output terminal and the first output terminal is coupled to the first differential input terminal (e.g., a non-inverting terminal) so as to provide a first signal path SX1 for the first input signal IN1. The second amplifier stage 132 includes a second differential amplifier AMP6 having a third input terminal (e.g., an inverting terminal), a fourth input terminal (e.g., a non-inverting terminal), and a second output terminal, wherein the third input terminal and the fourth input terminal are capable of receiving the first input signal IN1 and the second input signal IN2 respectively. The fourth input terminal is configured to be capacitively coupled to the second output terminal and the second output terminal is coupled to the second differential input terminal (e.g., an inverting terminal) so as to provide a second signal path SX2 for the second input signal IN2. The input terminals of the input differential amplifier unit 13 include the first to fourth input terminals, and the input differential amplifier unit 13 has a plurality of output terminals including the first and second output terminals. In this way, the input differential amplifier unit 13 provides a pair of capacitively coupled signal paths by way of the first and second signal paths SX1 and SX2.

In an embodiment, the input differential amplifier unit 13 includes a first capacitive coupling circuit 135, coupled between the first input terminal and the first output terminal; and a second capacitive coupling circuit 136, coupled between the fourth input terminal and the second output terminal.

In an embodiment, the first capacitive coupling circuit 135 includes a first capacitor (e.g., C3) coupled between the first input terminal and the first output terminal.

In an embodiment, the second capacitive coupling circuit 136 includes a second capacitor (e.g., C4) coupled between the fourth input terminal and the second output terminal.

In a practical application of the input buffer circuit 5, the first and fourth input terminals of the input differential amplifier unit 13 provide a pair of capacitively coupled signal paths (e.g., SX1, SX2) for receiving the differential input signal (e.g., IN1 and IN2) while the second and third input terminals of the input differential amplifier unit 13 provide a pair of signal paths (e.g., SN1, SN2) for the differential input signal. In a normal situation, there is no undesirable connection of the above input terminals to a voltage (e.g., a voltage source) or ground. In this normal situation, the pair of capacitively coupled signal paths (e.g., SX1, SX2) can couple the differential input signal to the differential amplifier stage 20 so that the buffer 30 can output the output single-ended signal which is based on the differential input signal. In this case, the first and fourth input terminals, which provide the pair of capacitively coupled signal paths, can be regarded as dominating the inputting of the differential input signal.

In an accidental situation that when one terminal of the second and third input terminals of the input differential amplifier unit 13 for providing the pair of signal paths (e.g., SN1 and SN2) is accidentally connected to a voltage (e.g., a voltage source) or ground, since the first and fourth input terminals, which provide the pair of capacitively coupled signal paths (e.g., SX1 and SX2), can dominate the inputting of the differential input signal for the input buffer circuit 5 so that the buffer 30 can still output the output single-ended signal as in the normal operation.

In another accidental situation that when one terminal of the first and fourth input terminals of the input differential amplifier unit 13 for providing the pair of capacitively coupled signal paths (e.g., SX1 and SX2) is accidentally connected to a voltage (e.g., a voltage source) or ground, the second and third input terminals, which provide the pair of signal paths (e.g., SN1 and SN2), can then dominate the inputting of the differential input signal for the input buffer circuit 5 and the differential input signal can be coupled to the differential amplifier stage 20 through the first and second amplifier stages 131 and 132 so that the buffer 30 can still output the output single-ended signal normally. For example, when the differential input signal is a differential clock signal, the input buffer circuit 5 can output the output single-ended signal having a duty cycle corresponding to that of the differential clock signal.

As compared to the conventional input buffer circuit having only one amplifier stage (or only one pair of signal paths) for the differential input signal, the input buffer circuit 5 is more reliable because of having two pairs of signal paths for the differential input signal, thereby further reducing the risks of accidental connection of the input terminal to a voltage or ground.

Thus, the circuit configuration of the input buffer circuit 5 can facilitate protection against accidental shorting of an input terminal of the input buffer circuit to a voltage or ground, enhancing the reliability of a device that employs the input buffer circuit 5.

In the above embodiments, the buffer 30 may include one or more inverters as a buffer. Certainly, the implementation of the present disclosure is not limited to the examples.

Figure 7:
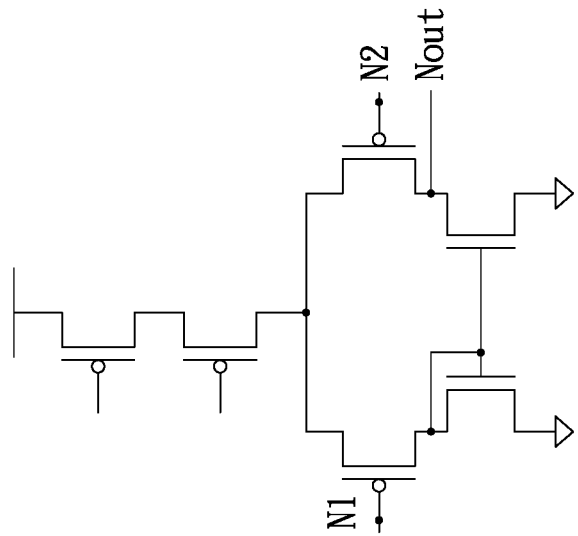
FIG. 7 is a schematic diagram illustrating another embodiment of a differential amplifier which can be utilized in implementation of the input buffer circuit.
Figure 6:
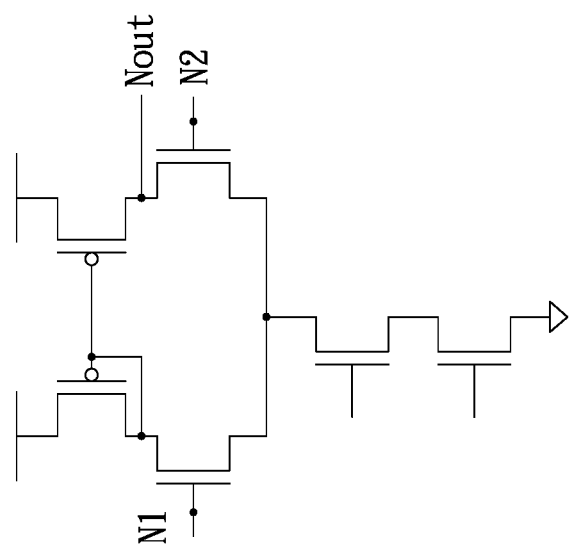
FIG. 6 is a schematic diagram illustrating an embodiment of a differential amplifier which can be utilized in implementation of the input buffer circuit.

In any of the embodiments of FIGS. 1-5, the input differential amplifier unit (e.g., 10A, 10B, 11-13) can be implemented by using differential amplifier(s), whenever appropriate. For example, an embodiment of a differential amplifier which can be utilized in implementation of the input buffer circuit is shown in FIG. 6. FIG. 7 illustrates another embodiment of a differential amplifier which can be utilized in implementation of the input buffer circuit. As shown in FIG. 6 or 7, the differential amplifier has two input terminals N1, N2 and an output terminal Nout.

In some embodiments, an input buffer circuit based on any one of the embodiments based on one of FIGS. 1-5 can be configured so that the capacitive coupling circuit can be realized or regarded as environmental elements. For example, an input terminal of the input buffer circuit is configured to be capacitively coupled so that the input terminal is capable of being coupled to a capacitive coupling circuit (e.g., a capacitor) which is regarded as an environmental element (e.g., the input buffer circuit may be implemented as a chip having some specific pins for a designer or technician to connect to one or more capacitive coupling circuits arbitrarily). In other embodiments, an input buffer circuit based on any one of the embodiments based on one of FIGS. 1-5 can be configured to include the capacitive coupling circuit(s) for the sake of usage or product manufacturing.

Further, as in the above embodiments, the input buffer circuit (e.g., FIGS. 1-5) can be exemplified to receive a differential input signal, such as a differential clock input signal. However, the implementation of the present disclosure is not limited to the type of input signals received by the input buffer circuit. In some examples of practical applications, a single-ended input signal, such as a clock signal, can be applied to the input buffer circuit to enable a device that adopts the input buffer circuit to receive either a differential input signal or a single-ended input signal. For example, the single-ended input signal can be regarded as either one of a first input signal and a second input signal (e.g., IN1 or IN2) of a differential input signal and applied to the input terminals for either the first input signal IN1 or second input signal IN2, wherein the other input terminals not receiving the single-ended input signal can be configured to connect to a DC voltage. In this way, the input buffer circuit, whenever appropriate, can also facilitate different types of input signals for a device that employs the input buffer circuit.

While the present disclosure has been described by way of specific embodiments, numerous modifications, combinations, and variations could be made thereto by those skilled in the art without departing from the scope and spirit of the present disclosure set forth in the claims.

What is claimed is:

1. An input buffer circuit, the input buffer circuit comprising:
an input differential amplifier unit having a plurality of input terminals and at least one output terminal, wherein at least two of the input terminals of the input differential amplifier unit are configured to be capacitively coupled respectively so as to provide at least one pair of capacitively coupled signal paths for a first input signal and a second input signal of a differential input signal;
a differential amplifier stage, coupled to the input differential amplifier unit, having a first differential input terminal, a second differential input terminal, and a corresponding output terminal, wherein the first differential input terminal and the second differential input terminal are capable of being coupled to the first input signal and the second input signal respectively; and
a buffer, coupled to the output terminal of the differential amplifier stage, for outputting an output single-ended signal,
wherein the input differential amplifier unit and the differential amplifier stage are coupled to provide the at least one pair of capacitively coupled signal paths for the differential input signal and to provide at least one pair of non-capacitively-coupled signal paths for the differential input signal.

2. The input buffer circuit according to claim 1, wherein the input differential amplifier unit includes a first amplifier stage including:
a first differential amplifier having a first input terminal, a second input terminal, and a first output terminal as the output terminal of the input differential amplifier unit, wherein the first input terminal and the second input terminal are configured to be capacitively coupled to the first input signal and the second input signal respectively so as to provide a pair of capacitively coupled signal paths for the first input signal and the second input signal, and the first output terminal is coupled to the corresponding output terminal of the differential amplifier stage;
wherein the first and second input terminals are the two input terminals of the input differential amplifier unit, and the first output terminal is the output terminal of the input differential amplifier unit;
wherein the first differential input terminal and the second differential input terminal are configured to provide a pair of non-capacitively-coupled signal paths for the first input signal and the second input signal.

3. The input buffer circuit according to claim 2, wherein the first amplifier stage further includes:
a capacitive coupling circuit, wherein the first input terminal and the second input terminal are capable of receiving the first input signal and the second input signal respectively through the capacitive coupling circuit.

4. The input buffer circuit according to claim 3, wherein the capacitive coupling circuit includes a first capacitor coupled to the first input terminal and a second capacitor coupled to the second input terminal.

5. The input buffer circuit according to claim 1, wherein the input differential amplifier unit includes:
a first amplifier stage including a first differential amplifier having a first input terminal, a second input terminal, and a first output terminal, wherein the first input terminal and the second input terminal are capable of receiving the first input signal and the second input signal respectively;
a second amplifier stage including a second differential amplifier having a third input terminal, a fourth input terminal, and a second output terminal, wherein the third input terminal and the fourth input terminal are configured to be capacitively coupled to the first input signal and the second input signal respectively so as to provide a first pair of capacitively coupled signal paths for the first input signal and the second input signal;
a third amplifier stage including a third differential amplifier having a fifth input terminal, a sixth input terminal, and a third output terminal, wherein the fifth input terminal and the sixth input terminal are capable of receiving the second input signal and the first input signal respectively; and
a fourth amplifier stage including a fourth differential amplifier having a seventh input terminal, an eighth input terminal, and a fourth output terminal, wherein the seventh input terminal and the eighth input terminal are configured to be capacitively coupled to the second input signal and the first input signal respectively so as to provide a second pair of capacitively coupled signal paths for the first input signal and the second input signal;
wherein the first and second output terminals are coupled to the first differential input terminal and the third and fourth output terminals are coupled to the second differential input terminal; and
wherein the input terminals of the input differential amplifier unit include the first to eighth input terminals, and the input differential amplifier unit has output terminals including the first to fourth output terminals.

6. The input buffer circuit according to claim 5, wherein the input differential amplifier unit further includes:
a first capacitive coupling circuit, wherein the third input terminal and the fourth input terminal are capable of receiving the first input signal and the second input signal respectively through the first capacitive coupling circuit; and
a second capacitive coupling circuit, wherein the seventh input terminal and the eighth input terminal are capable of receiving the second input signal and the first input signal respectively through the second capacitive coupling circuit.

7. The input buffer circuit according to claim 6, wherein the first capacitive coupling circuit includes a first capacitor coupled to the third input terminal and a second capacitor coupled to the fourth input terminal.

8. The input buffer circuit according to claim 6, wherein the second capacitive coupling circuit includes a third capacitor coupled to the seventh input terminal and a fourth capacitor coupled to the eighth input terminal.

9. The input buffer circuit according to claim 1, wherein the input differential amplifier unit includes:
a first amplifier stage including a first differential amplifier having a first input terminal, a second input terminal, and a first output terminal, wherein the first input terminal and the second input terminal are capable of receiving the first input signal and the second input signal respectively;

the first input terminal is configured to be capacitively coupled to the first output terminal and the first output terminal is coupled to the first differential input terminal so as to provide a first capacitively coupled signal path for the first input signal; and a second amplifier stage including a second differential amplifier having a third input terminal, a fourth input terminal, and a second output terminal, wherein the third input terminal and the fourth input terminal are capable of receiving the first input signal and the second input signal respectively; the fourth input terminal is configured to be capacitively coupled to the second output terminal and the second output terminal is coupled to the second differential input terminal so as to provide a second capacitively coupled signal path for the second input signal;

wherein the input terminals of the input differential amplifier unit include the first to fourth input terminals, and the input differential amplifier unit has a plurality of output terminals including the first and second output terminals.

10. The input buffer circuit according to claim 9, wherein the input differential amplifier unit includes:

a first capacitive coupling circuit, coupled between the first input terminal and the first output terminal; and a second capacitive coupling circuit, coupled between the fourth input terminal and the second output terminal.

11. The input buffer circuit according to claim 10, wherein the first capacitive coupling circuit includes a first capacitor coupled between the first input terminal and the first output terminal.

12. The input buffer circuit according to claim 10, wherein the second capacitive coupling circuit includes a second capacitor coupled between the fourth input terminal and the second output terminal.

13. The input buffer circuit according to claim 1, wherein the buffer includes at least one inverter.

14. The input buffer circuit according to claim 1, wherein the differential input signal is a differential clock signal.

* * * * *